United States Patent
Lee

(10) Patent No.: US 7,618,854 B2
(45) Date of Patent: Nov. 17, 2009

(54) HIGH FREQUENCY MOS TRANSISTOR, METHOD OF FORMING THE SAME, AND METHOD OF MANUFACTURING A SEMICONDUCTOR DEVICE INCLUDING THE SAME

(75) Inventor: Sun-Hak Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/032,377

(22) Filed: Feb. 15, 2008

(65) Prior Publication Data

US 2008/0138946 A1    Jun. 12, 2008

Related U.S. Application Data

(62) Division of application No. 11/181,395, filed on Jul. 14, 2005, now abandoned.

(30) Foreign Application Priority Data

Jul. 15, 2004    (KR) ...................... 10-2004-0055061

(51) Int. Cl.
*H01L 21/336* (2006.01)

(52) U.S. Cl. ........................ 438/197; 438/199; 438/200; 257/E29.279; 257/E29.027

(58) Field of Classification Search .................. 438/197, 438/199–200; 257/E29.279, E29.027
See application file for complete search history.

(56) References Cited

U.S. PATENT DOCUMENTS 5,514,608 A    5/1996    Williams et al.

| | | | |
|---|---|---|---|
| 6,657,265 B2 * | 12/2003 | Fujisawa et al. | ............ 257/380 |
| 6,683,349 B1 | 1/2004 | Taniguchi et al. | |
| 6,815,794 B2 * | 11/2004 | Shin et al. | ................... 257/500 |
| 6,897,525 B1 | 5/2005 | Kikuchi et al. | |
| 2005/0017298 A1 | 1/2005 | Xie et al. | |

FOREIGN PATENT DOCUMENTS

| JP | 2000183181 | 6/2000 |
|---|---|---|
| JP | 2003086790 | 3/2003 |
| KR | 1020010039882 A | 5/2001 |
| KR | 1020010039932 A | 5/2001 |

* cited by examiner

*Primary Examiner*—Thanh Nguyen
(74) *Attorney, Agent, or Firm*—Mills & Onello, LLP

(57) ABSTRACT

In a high frequency LDMOS transistor, a gate structure is formed on a substrate. A drain, doped with first type impurities at a first concentration, is formed on the substrate spaced apart from the gate structure. A buffer well, doped with the first type impurities at a second concentration lower than the first concentration, surrounds side and lower portions of the drain. A lightly doped drain, doped with the first type impurities at a third concentration lower than the second concentration, is formed between the buffer well and the gate structure. A source, doped with the first type impurities at the first concentration, is formed on the substrate adjacent to the gate structure and opposite to the drain with respect to the gate structure. Accordingly, an on-resistance decreases while a breakdown voltage increases in the LDMOS transistor without increasing a capacitance between the gate structure and the drain.

10 Claims, 9 Drawing Sheets

HIGH FREQUENCY MOS TRANSISTOR, METHOD OF FORMING THE SAME, AND METHOD OF MANUFACTURING A SEMICONDUCTOR DEVICE INCLUDING THE SAME

CROSS REFERENCE TO RELATED APPLICATION

This application is a divisional of U.S. application Ser. No. 11/181,395, filed on Jul. 14, 2005, which relies for priority upon Korean Patent Application No. 2004-55061, filed on Jul. 15, 2004, the contents of which are herein incorporated by reference in their entirety for all purposes.

BACKGROUND OF THE INVENTION

1. Field of the Invention

The present invention relates to a high frequency metal oxide semiconductor (MOS) transistor, a method of forming the same and a method of manufacturing a semiconductor device including the same. More particularly, the present invention relates to a high frequency lateral double-diffused (LD) MOS transistor, a method of forming the same, and a method of manufacturing a semiconductor device having the LDMOS transistor.

2. Description of the Related Art

Semiconductor transistors can generally be classified as a bipolar junction transistor (BJT) and a field effect transistor (FET) in accordance with the type of charge carrier thereof. While both electrons and holes carry charge in the BJT, only one of electrons or holes carry the charge in the FET. That is, charge in the BJT is carried by electrons and holes regardless of a transistor type such as an NPN transistor and a PNP transistor. However, charge in an N-type FET is carried by electrons, and charge in a P-type FET is carried by holes. The MOS transistor is type of FET, and enjoys widespread use in semiconductor devices.

The LDMOS transistor is most widely adapted to a lateral power device, and is characterized as having a high-input impedance and an expeditious response to a switching signal. The most important design factors of the LDMOS transistor are breakdown voltage and on-resistance. In particular, the breakdown voltage and the on-resistance greatly affect the performance of the LDMOS transistor when the LDMOS transistor is operated at a high frequency.

The breakdown voltage determines an operation voltage of a transistor. When a transistor operates as a rectifier and a switch at a high voltage, the breakdown voltage of a transistor is required to be high. In addition, when a transistor functions as a switch, an electrical resistance of a channel is required to be low in case the transistor is turned on (hereinafter, referred to as on-resistance of a transistor), and to be high in case the transistor is turned off (hereinafter, referred to as off-resistance of a transistor). In theory, the on-resistance of a transistor is to be zero, and the off-resistance of a transistor is to be infinite. However, in view of practical considerations, a transistor has a certain measurable amount of on-resistance and off-resistance, respectively. As a result, an excessively low off-resistance causes a leakage current, and an excessively high on-resistance leads to a fatal signal loss through a channel in real transistors.

Therefore, a transistor may be operated at a high voltage under the conditions of a high breakdown voltage and a low on-resistance. However, the breakdown voltage is generally incompatible with the on-resistance of a transistor. A high breakdown voltage necessarily causes a high on-resistance of a transistor, and a low on-resistance of a transistor necessarily requires a low breakdown voltage. When the breakdown voltage is low, a capacitance between a gate and a drain of a transistor is increased, so that an operation failure frequently occurs in a high frequency transistor.

SUMMARY OF THE INVENTION

The present invention provides a high frequency transistor capable of being operated at a high breakdown voltage and a low on-resistance.

The present invention also provides a method of forming the above high frequency transistor.

The present invention further provides a method of manufacturing a semiconductor device including the above high frequency transistor.

In one aspect, the present invention is directed to a high frequency transistor. A gate structure is formed on a substrate, and a drain doped with first type impurities at a first concentration is formed at a surface portion of the substrate spaced apart from the gate structure. A buffer well doped with the first impurities at a second concentration lower than the first concentration is formed in the substrate to surround the drain. A lightly doped drain (LDD) doped with the first impurities at a third concentration lower than the second concentration is formed at a surface portion of the substrate between the buffer well and the gate structure. A source doped with the first impurities at the first concentration is formed at a surface portion of the substrate adjacent to the gate structure opposite to the drain with respect to the gate structure.

In one embodiment, the substrate is doped with second type impurities having an electrical polarity opposite that of the first type impurities, and includes an epitaxial silicon layer thereon, the epitaxial silicon layer being doped with the second type impurities at a concentration lower than that of the substrate.

In another embodiment, the transistor further comprises a body doped with the second type impurities and formed in the substrate opposite to the buffer well with respect to the gate structure, the body being extending to a region beneath the gate structure, thereby making contact with the LDD.

In another embodiment, the transistor further comprises a sinker doped with the second type impurities more deeply than the body, the sinker making contact with the body. In another embodiment, a bottom of the sinker makes contact with a surface of the substrate. In another embodiment, the sinker is doped with impurities more heavily than the body.

In another embodiment, the transistor further comprises a contact region doped with the second type impurities at a surface portion of the substrate adjacent to the source.

In another aspect, the present invention is directed to a method of forming a high frequency transistor. First type impurities are implanted through a surface of a semiconductor substrate on which a semiconductor layer is formed at a second concentration, thereby forming a buffer well in the substrate. A gate structure is formed on the substrate spaced apart from the buffer well. A lightly doped drain (LDD) is formed at a surface portion of the substrate by implanting the first type impurities at a third concentration lower than the second concentration through the surface of the substrate between the gate structure and the buffer well. A source of the LDMOS transistor is formed adjacent to the gate structure by implanting the first type impurities through the surface of the substrate adjacent to the gate structure, opposite to the LDD with respect to the gate structure, at a first concentration higher than the second concentration. A drain of the LDMOS transistor is formed at a surface portion of the substrate corresponding to the drain well by implanting the first impurities through the surface of the substrate corresponding to the buffer well.

In one embodiment, the semiconductor layer is formed through an epitaxial process.

In another embodiment, the substrate is doped with second type impurities having an electrical polarity opposite that of the first type impurities, and the semiconductor layer is doped with the second type impurities at a concentration lower than that of the substrate.

In another embodiment, the method further comprises forming a body by implanting second type impurities having an electrical polarity that is opposite that of the first type impurities through the surface of the substrate opposite to the buffer well with respect to the gate structure, subsequent to forming the gate structure, the second impurities being diffused into a channel region under the gate structure.

In another embodiment, the method further comprises forming a sinker by implanting the second type impurities through the surface of the substrate more deeply than the body prior to forming the buffer well, so that the sinker makes contact with the body.

In another embodiment, the second type impurities for forming the sinker are implanted to such a depth that a bottom of the sinker makes contact with the substrate.

In another embodiment, the method further comprises forming a contact region by implanting impurities of which an electrical polarity is opposite to that of impurities in the source through the surface of the substrate adjacent to the source, subsequent to forming the source.

In another embodiment, the buffer well is formed through a retrograde junction by gradually changing ion implantation energy during the ion implantation process.

In another embodiment, the drain is formed such that the buffer well surrounds side and lower portions of the drain.

In another aspect, the present invention is directed to a method of manufacturing a semiconductor device. A semiconductor substrate on which a semiconductor layer is formed is provided, and a surface of the substrate is divided into a lateral double-diffused metal oxidation of silicon (LDMOS) region in which an LDMOS transistor is formed, a PMOS region in which a P-type transistor is formed and an NMOS region in which an N-type transistor is formed. N-type impurities are partially implanted into the LDMOS region and the PMOS region at a second concentration, so that a buffer N-well is formed on a first portion of the LDMOS region and the N-well of the P-type transistor is formed on the PMOS region. A P-well of the N-type transistor is formed on the NMOS region by partially implanting P-type impurities into the NMOS region. First, second and third gate structures are formed on the LDMOS region spaced apart from the buffer N-well, on the NMOS region and the PMOS region, respectively. A lightly doped drain (LDD) is formed on the LDMOS region by implanting N-type impurities into the LDMOS region between the first gate structure and the buffer N-well, and a lightly doped N-type area is formed on the NMOS region around the second gate structure by implanting the N-type impurities into the NMOS region at a third concentration lower than the second concentration. A source and a drain of the LDMOS transistor are formed at surface portions of the LDMOS region and source and drain regions of the N-type transistor are formed at surface portions of the NMOS region by partially implanting N-type impurities into the LDMOS and NMOS regions of the substrate at a first concentration higher than the second concentration. The source of the LDMOS transistor is formed adjacent to the first gate structure on a second portion of the LDMOS region, opposite to the first portion of the LDMOS region with respect to the first structure. The drain of the LDMOS transistor is formed on a substrate corresponding to the buffer N-well, and the source and drain of the NMOS transistor are formed adjacent to the second gate structure and opposite to each other with respect to the second gate structure. A source and a drain of the P-type transistor are formed at surface portions of the PMOS region by partially implanting P-type impurities into the PMOS region adjacent to the third gate structure and opposite to each other with respect to the third gate structure. According to the present invention, the buffer well surrounds the drain of the transistor, so that an on-resistance of the transistor is decreased and electrical characteristics of the transistor are improved. In addition, the buffer well is not overlapped with the gate structure of the transistor, so that a capacitance between the gate structure and the drain is not increased despite the buffer well. Therefore, frequency characteristics of the transistor are not deteriorated due to the buffer well.

In one embodiment, the semiconductor layer is formed through an epitaxial process.

In another embodiment, the substrate is doped with P-type impurities, and the semiconductor layer is doped with the P-type impurities at a concentration lower than that of the semiconductor substrate.

In another embodiment, the method further comprises forming a P-type body in a second portion of the LDMOS region by implanting P-type impurities through a surface of the second portion of the LDMOS region subsequent to forming the first gate structure, the P-type impurities being diffused into a channel region under the first gate structure, so that the P-type body is extended into the channel region.

In another embodiment, the method further comprises forming a P-sinker in the substrate of the second portion of the LDMOS region by implanting P-type impurities more deeply than the body, so that the P-sinker makes contact with the P-type body.

In another embodiment, the second type impurities for forming the P-sinker are implanted to a depth such that a bottom of the P-sinker makes contact with the substrate.

In another embodiment, the method further comprises forming a contact region at a surface portion of the second portion of the LDMOS region adjacent to the source of the LDMOS transistor by implanting P-type impurities through a surface of the substrate corresponding to the second portion of the LDMOS region subsequent to forming the source, so that the contact region makes contact with the source of the LDMOS transistor in the P-type body.

In another embodiment, the buffer N-well and the N-well of the P-type transistor are each formed as a retrograde junction by gradually changing an ion implantation energy during the ion implantation process.

In another embodiment, the method further comprises forming spacers at sidewalls of the first, second and third gate structures subsequent to forming the LDD and the lightly doped N-type areas.

In another embodiment, the drain of the LDMOS transistor is formed such that the buffer N-well surrounds side and lower portions of the drain of the LDMOS transistor.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
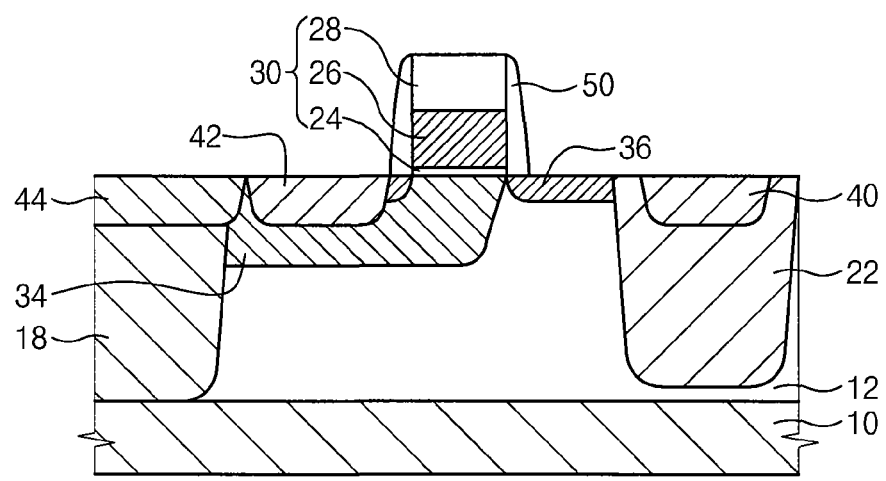
FIG. 1 is a cross sectional view illustrating a high frequency LDMOS transistor in accordance with a first exemplary embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. Like numbers refer to like elements throughout the specification.

Embodiment 1

FIG. 1 is a cross sectional view illustrating a high frequency LDMOS transistor in accordance with a first exemplary embodiment of the present invention.

Referring to FIG. 1, a semiconductor layer 12 is formed through an epitaxial process on a semiconductor substrate 10 heavily doped with P-type impurities. In the present embodiment, the semiconductor layer 12 on the semiconductor substrate 10 is formed to a thickness in a range from about 1 μm to about 10 μm, and is doped with P-type impurities at a relatively lower concentration than the semiconductor substrate 10.

A gate structure 30 is formed on the semiconductor layer 12. The gate structure 30 includes a gate insulation pattern 24 having a uniform thickness, a gate electrode pattern 26 and a hard mask pattern 28 that are sequentially stacked on the semiconductor layer 12 in the order named above. A spacer 50 is formed on a side surface of the gate structure 30.

N-type impurities are implanted at a surface portion of the semiconductor layer 12 apart from the gate structure 30 at a first concentration, so that a drain 40 is formed beneath a surface of the semiconductor layer 12.

The N-type impurities are implanted into a surface portion of the semiconductor layer 12 apart from the gate structure 30 more deeply than the drain 40 at a second concentration lower than the first concentration of the drain 40, so that a buffer well 22 is formed under the upper surface of the semiconductor layer 12. As a result, the drain 40 is surrounded by the buffer well 22, and is not overlapped with the gate structure 30. In the present embodiment, the buffer well 22 is a kind of a retrograde junction of which a concentration is gradually degraded from a lower portion of thereof to an upper portion thereof.

The N-type impurities further implanted at a surface portion of the semiconductor layer 12 between the buffer well and the gate structure 30 at a third concentration lower than the second concentration of the buffer well 22, so that a lightly doped drain 36 (hereinafter, referred to as LDD) is formed between the gate structure 30 and the buffer well 22. In the present embodiment, the LDMOS transistor is included in a radio frequency (RF) power device such as an RF power amplifier; thus, the LDD may be referred to as an RF-LDD in such a case. However, the LDMOS transistor of the present invention is not limited to the above exemplary RF power device, as would be known to one of the ordinary skill in the art. A breakdown voltage and an on-resistance of the LDMOS transistor of the present invention is determined in accordance with an impurity concentration of the LDD 36 corresponding to the third concentration in the present embodiment. In detail, when the third concentration of impurities in the LDD 36 is sufficiently low, the on-resistance of the LDMOS is maintained to be high despite an advantage that the breakdown voltage is maintained to be sufficiently high, thereby reducing an operation speed of the LDMOS transistor. In contrast, when the third concentration of impurities in the LDD 36 is sufficiently high, the on-resistance of the LDMOS is maintained to be sufficiently low with a disadvantage in that the breakdown voltage is maintained to be excessively low.

N-type impurities are further additionally implanted at a surface portion of the semiconductor layer 12 adjacent to the gate structure 30 opposite to the drain 40 at a fourth concentration, so that a source 42 is formed beneath the surface of the semiconductor layer 12, opposite the drain 40 with respect to the gate structure 30.

A P-type body 34 including P-type impurities is formed at a channel region of the LDMOS transistor, thus making contact with a side portion of the LDD 36.

A P-sinker 18, doped with the P-type impurities more deeply than the P-type body 34, is formed under the surface of the semiconductor layer 12, thus the P-sinker 18 makes contact with the P-type body 34 and the substrate 10 doped with P-type impurities. In the present embodiment, the P-sinker 18 is doped with the P-type impurities more heavily than the P-type body 34, and is not overlapped with the gate electrode structure 30. As a result, the P-sinker 18 has no effect on the channel region of the LDMOS transistor. A contact region 44 doped with P-type impurities is formed at a surface portion of the semiconductor layer 12, and makes contact with the source 42.

In the above high frequency LDMOS transistor, the drain 40 heavily doped with N-type impurities is surrounded by the buffer well 22, so that a bulk leakage current downwardly leaked to a bottom of the substrate 10 is minimized. In addition, the buffer well 22 is not overlapped with the gate structure 30, so that a capacitance between the gate structure 30 and the drain 40 is not increased despite the buffer well 22. In addition, the buffer well 22 is doped with the N-type impurities more heavily than the LDD 36, so that the on-resistance of the LDMOS transistor is sufficiently reduced, thereby improving electrical characteristics thereof.

FIGS. 2 to 6 are cross sectional views illustrating processing steps for a method of forming the high frequency LDMOS transistor shown in FIG. 1.

Figure 2:
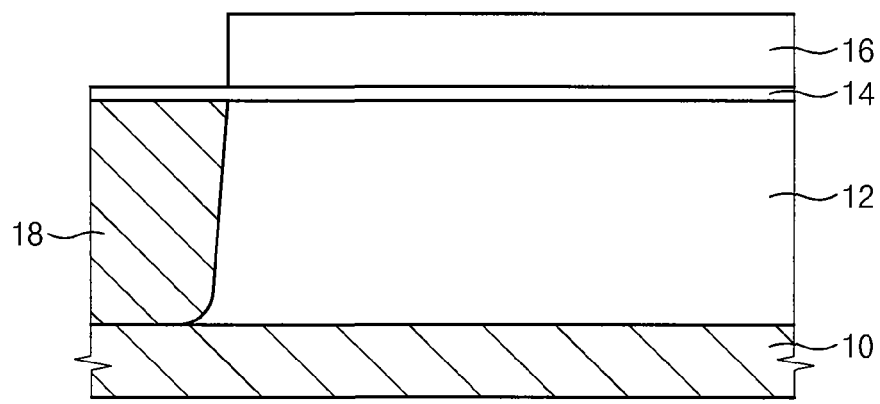
FIGS. 2 to 6 are cross sectional views illustrating processing steps for a method of forming the high frequency LDMOS transistor shown in FIG. 1.

Referring to FIG. 2, a semiconductor layer 12 is formed to a thickness of about 1 μm to about 10 μm on a semiconductor substrate 10 heavily doped with P-type impurities through an epitaxial process, and the P-type impurities are implanted at a surface portion of the semiconductor layer 12 more lightly than the substrate 10 in-situ with the above epitaxial process or in an additional process separate from the epitaxial process.

A buffer oxide layer 14, for example a silicon oxide layer, is formed on the semiconductor layer 12 for preventing damage to the surface of the semiconductor layer 12 during a subsequent ion implantation process. A first photoresist pattern 16 is formed on the buffer oxide layer 14 by a photolithography process, so that the buffer oxide layer 14 is partially exposed through the first photoresist pattern 16. In a subsequent process, the P-sinker 18 is to be formed in the semiconductor layer 12 corresponding to the exposed buffer oxide layer 14.

Then, P-type impurities are implanted into the semiconductor layer 12, using the first photoresist pattern 16 as an ion implantation mask, more heavily than the semiconductor layer 12, thereby forming the P-sinker 18 doped with the P-type impurities more heavily than the semiconductor layer 12. In the present embodiment, the ion implantation process for forming the P-sinker 12 is controlled to such a depth that a bottom of the P-sinker 18 makes contact with a top surface of the substrate 10 doped with the P-type impurities. Thereafter, the first photoresist pattern 16 is removed from the semiconductor layer 12.

Next, an isolation layer (not shown) is formed on the substrate 10 through a shallow trench isolation (STI) process or a local oxidation of silicon (LOCOS) process, so that an active region and a field region are defined on the substrate 10 by the isolation layer. Conductive structures on the active region are electrically isolated from each other, so that the isolation layer for defining the active region and the field region is referred to as a device isolation layer hereinafter.

Figure 3:
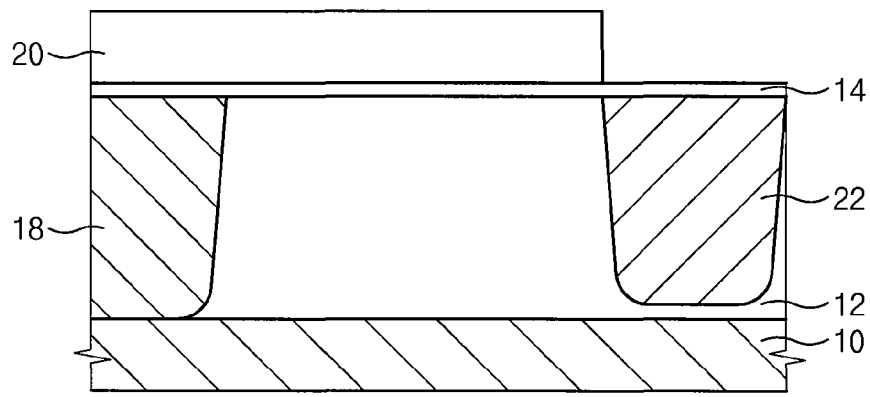

Referring to FIG. 3, a second photoresist pattern 20 is additionally formed on the buffer oxide layer 14 by a photolithography process, so that the buffer oxide layer 14 is partially exposed through the second photoresist pattern 20. In a subsequent process, the drain 40 in FIG. 1 of the LDMOS transistor is to be formed in the semiconductor layer 12 corresponding to the exposed buffer oxide layer 14 by the second photoresist pattern 20. In the present embodiment, the semiconductor layer 12 in which the gate structure 30 in FIG. 1 is to be formed in a subsequent process is still covered with the second photoresist pattern 20.

Then, N-type impurities are implanted into the semiconductor layer 12 using the second photoresist pattern 20 as an ion implantation mask at a second concentration, thereby forming the buffer well 22 in the semiconductor layer 12. In the present embodiment, the buffer well 22 is formed as a retrograde junction by a high-energy ion implanter. In detail, the high-energy ion implanter implants the N-type impurities deeply into the semiconductor layer 12 under conditions of a high energy and a high current to thereby form a bottom portion of the buffer well 22, and shallowly into the semiconductor layer 12 under conditions of a low energy and a low current to thereby form an upper portion of the buffer well 22. According to the above-mentioned process, a gradient of the impurity concentration along the depth of the semiconductor layer 12 may be minimized in the retrograde junction. Thereafter, the second photoresist pattern 20 is removed from the semiconductor layer 12. In the present embodiment, the buffer oxide layer is also removed from the semiconductor layer 12 during the removing process of the second photoresist pattern 20.

Figure 4:
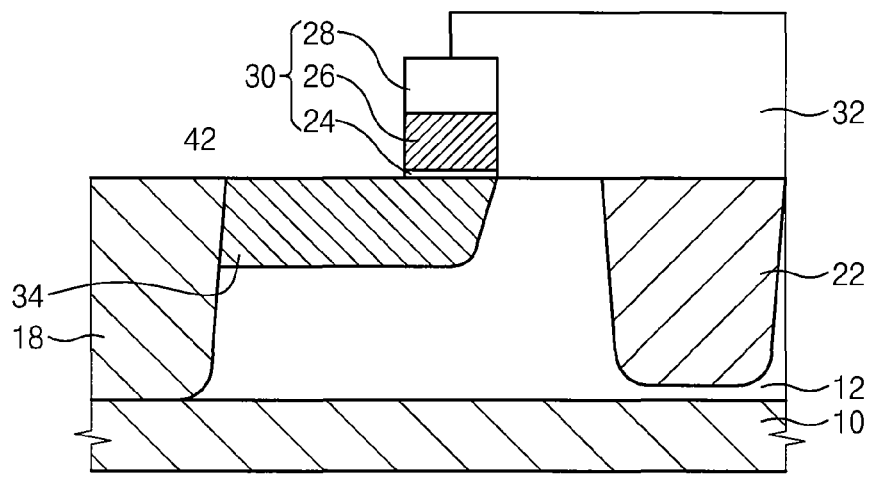

Referring to FIG. 4, a gate insulation layer (not shown), a gate electrode layer (not shown) and a hard mask layer (not shown) are sequentially formed to a uniform predetermined thickness on the semiconductor layer 12. Next, the hard mask layer, gate electrode layer and the gate insulation layer are sequentially patterned, so that the gate insulation pattern 24, the gate electrode pattern 26 and the hard mask pattern 28 are formed on the semiconductor layer 12 spaced apart from the buffer well 22 by a predetermined distance. The gate insulation pattern 24, the gate electrode pattern 26 and the hard mask pattern 28 sequentially stacked on the semiconductor layer 12 and spaced apart from the buffer well 22 is referred to as the gate structure 30. The semiconductor layer 12 is separated into two portions, a first portion including the buffer well 22 and a second portion including the P-sinker 18.

A third photoresist pattern 32 is formed on the semiconductor layer 12 such that a surface of the first portion of the semiconductor layer 12 is covered and a surface of the second portion of the semiconductor layer 12 is exposed through the third photoresist pattern 32. Then, P-type impurities are implanted at a surface portion of the second portion of the semiconductor layer 12 using the third photoresist pattern 32 as an ion implantation mask, and are diffused under the gate structure 30, thereby forming the P-type body 34. In the present embodiment, a channel of a transistor is to be formed at a portion of the P-type body 34 beneath the gate structure 30 in a subsequent process. In addition, the P-type body 34 also makes contact with the P-sinker 18, so that the P-type body 34 is electrically connected to the semiconductor substrate 10 via the P-sinker 18. Thereafter, the third photoresist pattern 32 is removed from the semiconductor layer 12 through an ashing process and a stripping process.

Figure 5:
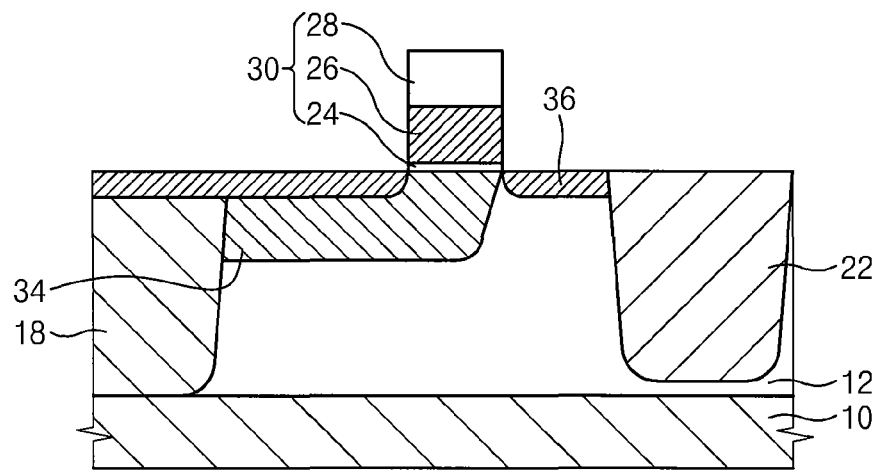

Referring to FIG. 5, N-type impurities are implanted at a surface portion of the first portion of the semiconductor layer 12 adjacent to the gate structure 30 at a third concentration lower than the second concentration, thereby forming the lightly doped drain (LDD) 36 in the semiconductor layer 12. In the present embodiment, a lightly doped source (not shown) may be formed simultaneously with the LDD 36 in the second portion of the semiconductor layer 12.

Figure 6:
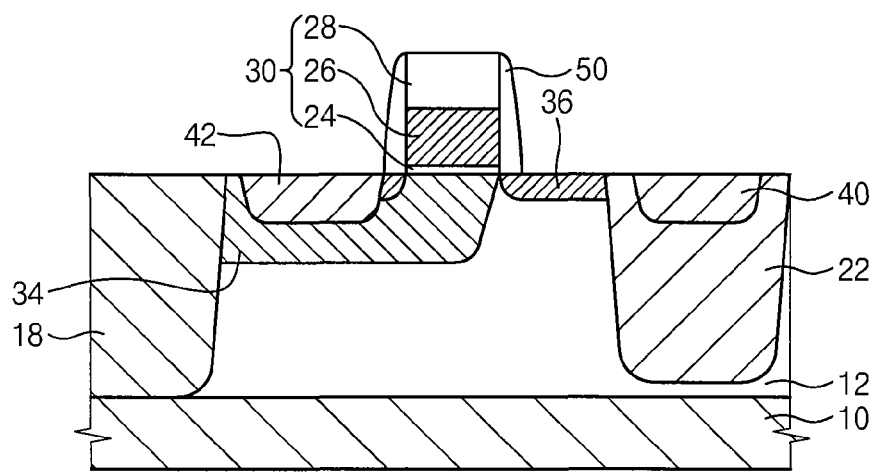

Referring to FIG. 6, an insulation layer (not shown) such as a silicon nitride layer is formed on the semiconductor layer 12 to a sufficient thickness to cover the gate structure 30, and the insulation layer is removed and planarized until a top surface of the gate structure 30 is exposed. Then, the insulation layer is anisotropically etched away from the semiconductor layer 12 to thereby form a spacer 50 at a side surface of the gate structure 30.

A fourth photoresist pattern (not shown) is formed on the semiconductor layer 12, and a surface of the second portion of the semiconductor layer 12 adjacent to the spacer 50 and a surface of the buffer well 22 are partially exposed through the fourth photoresist pattern.

N-type impurities are implanted at a surface portion of the second portion of the semiconductor layer 12 adjacent to the spacer 50, thereby forming a source 42 of the LDMOS transistor of the present invention opposite to the LDD 36 with respect to the gate structure 30. The N-type impurities are implanted at a surface portion of the buffer well 22 of which a portion is exposed by the fourth photoresist pattern simultaneously with the ion implantation process for the source 42, thereby forming the drain 40 of the LDMOS transistor. In the present embodiment, the N-type impurities are implanted at the surface of the buffer well 22 more shallowly than the buffer well 22, so that the drain 40 is surrounded by the buffer well 22. In addition, the N-type impurities for the source 42 and the drain 40 are implanted into the semiconductor layer 12 at a first concentration higher than the second concentration.

P-type impurities are further heavily implanted to a surface portion of the second portion of the semiconductor layer 12 adjacent to the source 42, thereby forming the contact region 44 in FIG. 1 making contact with the source 42. The LDMOS transistor is completed through the above-mentioned processes.

Embodiment 2

FIGS. 7 to 11 are cross sectional views illustrating processing steps for a method of manufacturing a semiconductor device having both a high frequency LDMOS transistor and a CMOS transistor according to a second exemplary embodiment of the present invention.

Figure 7:
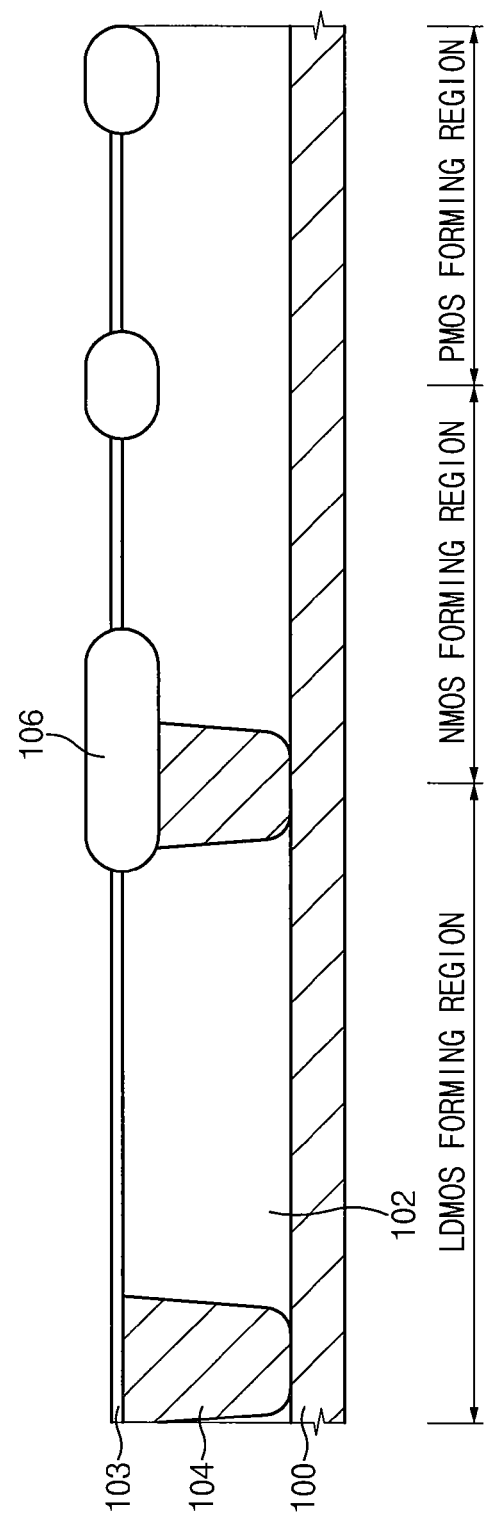
FIGS. 7 to 11 are cross sectional views illustrating processing steps for a method of manufacturing a semiconductor device having both a high frequency LDMOS transistor and a CMOS transistor according to a second exemplary embodiment of the present invention.

Referring to FIG. 7, a semiconductor layer 102 is formed to a thickness of about 1 μm to about 10 μm on a semiconductor substrate 100 heavily doped with P-type impurities through an epitaxial process, and the P-type impurities are implanted through a surface of the semiconductor layer 102 more lightly than the substrate 100 in-situ with the above epitaxial process or in an additional process different from the epitaxial process. In the present embodiment, the semiconductor layer 102 is divided into three distinct regions: an LDMOS region in which the high frequency LDMOS transistor is to be formed, an NMOS region in which an NMOS transistor of a CMOS transistor is formed and a PMOS region in which a PMOS transistor of a CMOS transistor is formed. The NMOS region and the PMOS region may together be referred to as a CMOS region.

A buffer oxide layer 103, for example a silicon oxide layer, is formed on the semiconductor layer 102 for preventing damage to the surface of the semiconductor layer 102 during a subsequent ion implantation process. A first photoresist pattern (not shown) is formed on the buffer oxide layer 103 by a photolithography process, so that the buffer oxide layer 103 is partially exposed through the first photoresist pattern.

Then, the P-sinker 104 is formed in the semiconductor layer 102 corresponding to a source region of the LDMOS transistor and a boundary area of the LDMOS region and the CMOS region. In detail, P-type impurities are implanted into the semiconductor layer 102, using the first photoresist pattern as an ion implantation mask, more heavily than the semiconductor layer 102, thereby forming the P-sinker 104 doped with the P-type impurities more heavily than the semiconductor layer 102. In the present embodiment, the ion implantation process for forming the P-sinker 104 is controlled to such a depth that a bottom of the P-sinker 104 makes contact with a top surface of the substrate 100 doped with the P-type impurities. Thereafter, the first photoresist pattern is removed from the semiconductor layer 102.

Next, an isolation layer 106 is formed on the substrate 100 through a shallow trench isolation (STI) process or a local oxidation of silicon (LOCOS) process, so that an active region and a field region are defined on the substrate 100 by the isolation layer 106. In the same reason as in Embodiment 1, the isolation layer 106 is referred to as a device isolation layer hereinafter. In the present embodiment, the device isolation layer 106 is formed on the semiconductor layer 102 between the LDMOS region and the CMOS region and on the semiconductor layer 102 between the NMOS region and the PMOS region.

Figure 8:
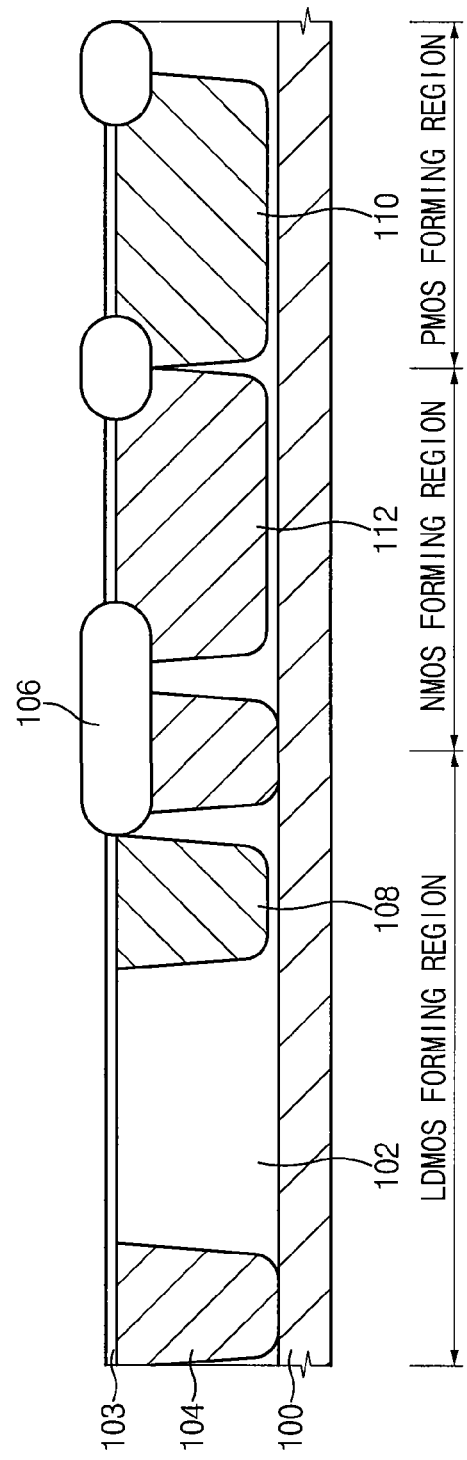

Referring to FIG. 8, a second photoresist pattern (not shown) is additionally formed on the buffer oxide layer 103 by a photolithography process, so that the buffer oxide layer 103 corresponding to a first portion of the LDMOS region and the PMOS region is partially exposed through the second photoresist pattern. In a subsequent process, a drain of the LDMOS transistor is to be formed on the first portion of the LDMOS region.

Then, N-type impurities are implanted into the semiconductor layer 102 using the second photoresist pattern as an ion implantation mask at a second concentration, thereby forming the buffer well 108 in semiconductor layer 102 corresponding to the first portion of the LDMOS region. In the present embodiment, the N-type impurities are implanted into the semiconductor layer 102 in such a manner that a gate region in which a gate structure is to be formed in the LDMOS region is not overlapped with the buffer well 108. In addition, an N-well 110 doped with N-type impurities is formed in the PMOS region simultaneously with the formation of the buffer well 108.

In the present embodiment, the buffer well 108 and the N-well 110 of a PMOS transistor are formed as a retrograde junction by a high-energy ion implanter. In detail, the high-energy ion implanter implants the N-type impurities deeply into the semiconductor layer 102 under conditions of a high energy and a high current to thereby form a bottom portion of the buffer well 108 and the N-well 110, and shallowly into the semiconductor layer 102 under conditions of a low energy and a low current to thereby form an upper portion of the buffer well 108 and the N-well 110. According to the above-mentioned process, a gradient of the impurity concentration along the depth of the semiconductor layer 102 may be minimized in the retrograde junction. As described above, the N-well 110 of the PMOS transistor and the buffer well 108 of the LDMOS transistor are formed simultaneously with each other, so that an additional process for forming the buffer well 108 is not required in the present embodiment. Thereafter, the second photoresist pattern is removed from the semiconductor layer 102 through an ashing process and a strip process. Then, a third photoresist pattern (not shown) is formed on the buffer oxide layer 103, so that the NMOS region is partially exposed through the third photoresist pattern.

P-type impurities are implanted through the exposed surface of the semiconductor layer 102 corresponding to the NMOS region using the third photoresist pattern as an ion implantation mask, thereby forming a P-well 112 of the NMOS transistor. Thereafter, the third photoresist pattern is removed from the semiconductor layer 102 through an ashing and stripping process. In the present embodiment, the buffer oxide layer 103 is removed from the semiconductor layer 102 simultaneously with the process for removing the third photoresist pattern.

Figure 9:
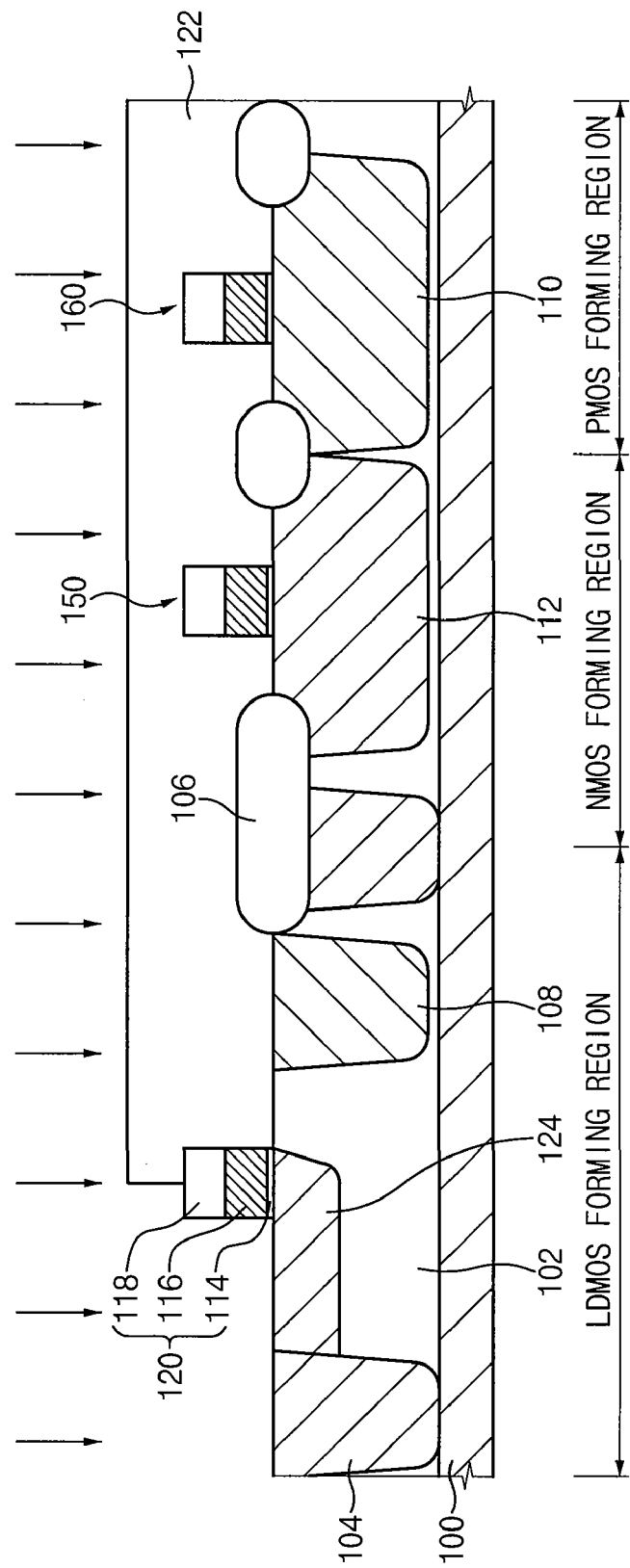

Referring to FIG. 9, a gate insulation layer (not shown), a gate electrode layer (not shown) and a hard mask layer (not shown) are sequentially formed on the semiconductor layer 102. In the present embodiment, silicon oxide is deposited onto the semiconductor layer 102, thereby forming the gate insulation layer. Next, the hard mask layer, gate electrode layer and the gate insulation layer are sequentially etched away from the semiconductor layer 102, so that the gate insulation pattern 114, the gate electrode pattern 116 and the hard mask pattern 118 are formed on the semiconductor layer 102, thereby forming gate structures 120, 150 and 160 on the semiconductor layer 102. In the present embodiment, a first gate structure 120 is formed on the semiconductor layer 102 spaced apart from the buffer well 108 by a predetermined distance. A second gate structure 150 is formed on a surface of the P-well 112 of the NMOS region, and a third gate structure 160 is formed on a surface of the N-well 110 of the PMOS region. As an exemplary embodiment, the first, second and third gate structures 120, 150 and 160 are utilized as gate electrodes of the LDMOS transistor, the NMOS transistor and the PMOS transistor, respectively.

The gate insulation layer patterns of the first, second and third gate structures have a uniform thickness. A fourth photoresist pattern 122 is formed on the semiconductor layer 102 such that the first portion of the LDMOS region and the CMOS region are covered and a second portion of the LDMOS region opposite to the first region of the first gate structure 120 is exposed. Then, P-type impurities are implanted at a surface portion of the second portion of the LDMOS region using the fourth photoresist pattern 122 as an ion implantation mask, and are diffused under the first gate structure 120, thereby forming the P-type body 124. In the present embodiment, a channel of a transistor is to be formed at a portion of the P-type body 124 beneath the first gate structure 120 in a subsequent process. In addition, the P-type body 124 also makes contact with the P-sinker 104, so that the P-type body 124 is electrically connected to the semiconductor substrate 100 via the P-sinker 104. Thereafter, the fourth photoresist pattern 122 is removed from the semiconductor layer 104 through an ashing process and a stripping process.

Figure 10:
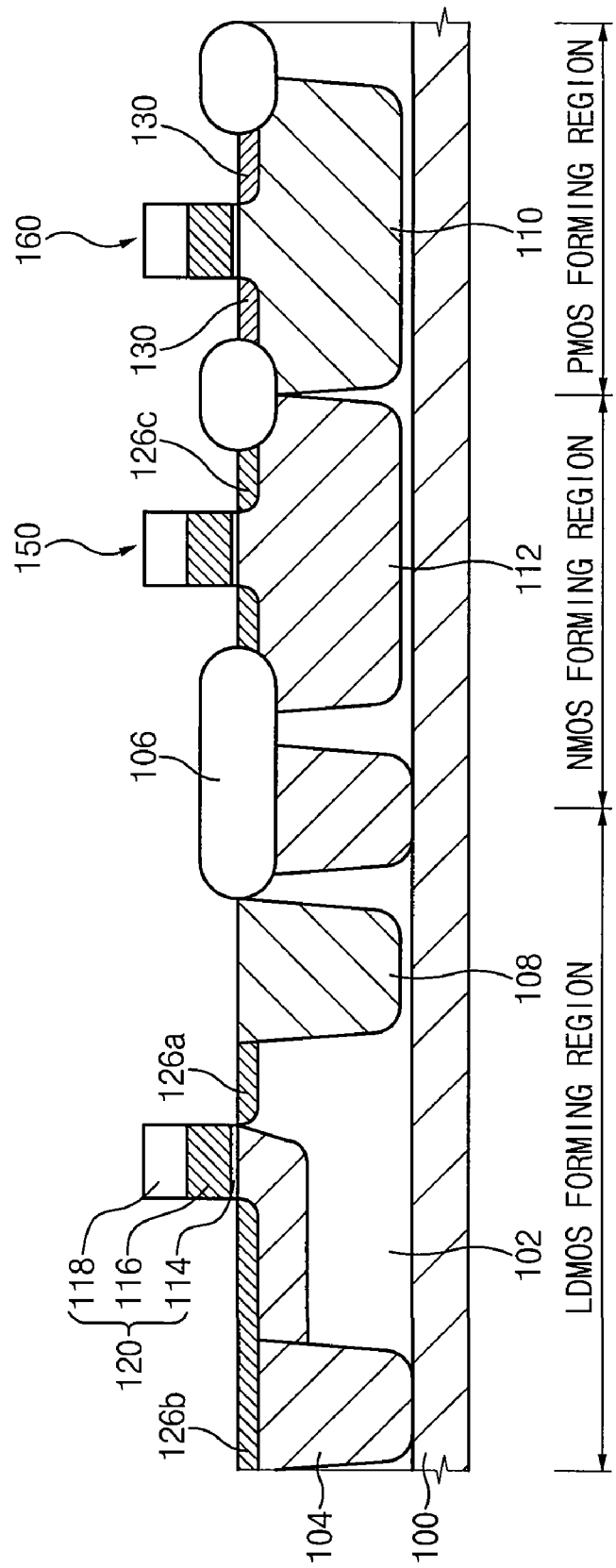

Referring to FIG. 10, N-type impurities are implanted at the surface portions of the first portion of the LDMOS region between the first gate structure 120 and the buffer well 108 at a third concentration lower than the second concentration, thereby forming a lightly doped drain (LDD) 126a in the semiconductor layer 102. In the present embodiment, the N-type impurities are also lightly implanted at the surface portions of the second portion of the LDMOS region adjacent to the first gate structure 120 simultaneously with the ion implantation process for forming the LDD 126a, so that a lightly doped source 126b is formed at the second portion of the LDMOS region. In addition, the N-type impurities are implanted at surface portions of the NMOS region simultaneously with the ion implantation process for forming the LDD 126a, so that lightly doped N-type area 126c is formed on the NMOS region around the second gate structure 150. The lightly doped N-type areas 126c may be formed through an additional ion implantation process different from the above ion implantation process for the formation of the LDD 126a, as would be known to one of the ordinary skill in the art. Then, P-type impurities are implanted at surface portions of the PMOS region, so that a lightly doped P-type area 130 is formed on the PMOS region around the third gate structure 160.

Figure 11:
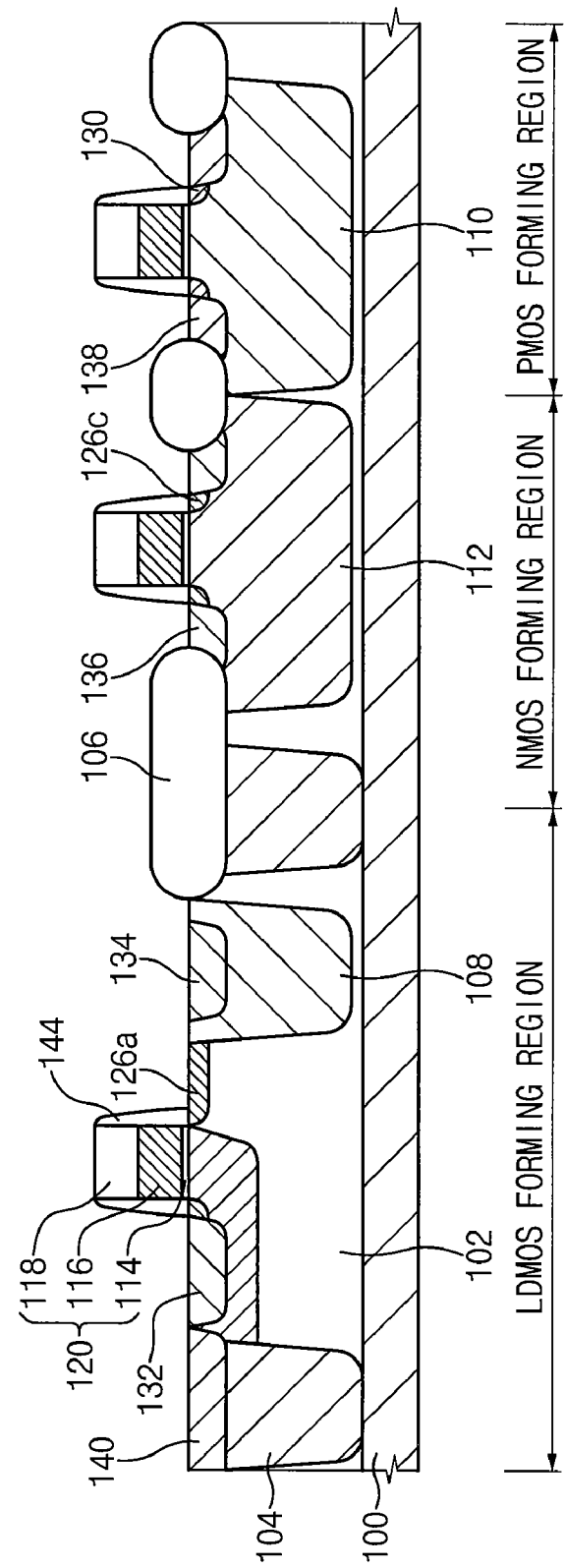

Referring to FIG. 11, an insulation layer (not shown) such as a silicon nitride layer is formed on the semiconductor layer 102 to a sufficient thickness to cover the first, second and third gate structures 120, 150 and 160, and the insulation layer is removed and planarized until top surfaces of the first, second and third gate structures 120, 150 and 160 are exposed. Then, the insulation layer is anisotropically etched away from the semiconductor layer 102 to thereby form a spacer 144 at each side surface of the first, second and third gate structures 120, 150 and 160.

A fifth photoresist pattern (not shown) is formed on the semiconductor layer 102 in such a structure that a surface of the second portion of the LDMOS region adjacent to the spacer 144 and a surface of the buffer well 108 are partially exposed. Then, N-type impurities are implanted at the surface portions of the second portion of the LDMOS region adjacent to the spacer 144, thereby forming a source 132 of the LDMOS transistor opposite to the LDD 126a with respect to the first gate structure 120. The N-type impurities are implanted through a surface of the buffer well 108 of which a portion is exposed by the fifth photoresist pattern simultaneously with the ion implantation process for the source 132, thereby forming a drain 134 of the LDMOS transistor. In addition, the N-type impurities are implanted into the surface portions of the NMOS region simultaneously with the ion implantation process for forming the source and drain 132 and 134 of the LDMOS transistor, thereby forming a source/drain 136 of the NMOS transistor. The source/drain 136 of the NMOS transistor may be formed in an additional process different from the ion implantation process for forming the source and drain 132 and 134 of the LDMOS transistor, as would be known to one of the ordinary skill in the art. In the present embodiment, the N-type impurities are implanted at the surface of the buffer well 108 more shallowly than the buffer well 108, so that the drain 134 is surrounded by the buffer well 108. In addition, the N-type impurities for the source 132 and the drain 134 are implanted into the semiconductor layer 102 at a first concentration higher than the second concentration.

Then, P-type impurities are heavily implanted to a surface portion of the second portion of the LDMOS region adjacent to the source 132, thereby forming a contact region 140 making contact with the source 132.

Figure 12:
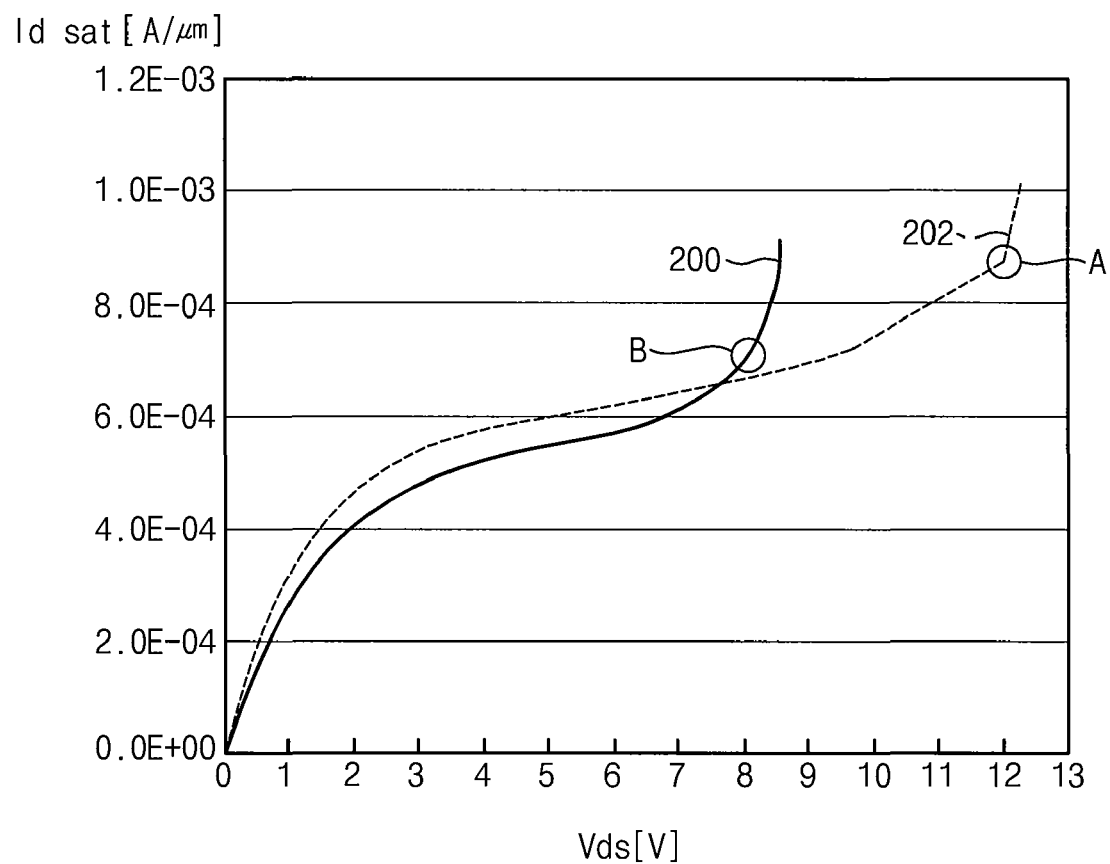
FIG. 12 is a graph illustrating a relation between a voltage and a current of a high frequency LDMOS transistor including a buffer P-well according to an exemplary embodiment of the present invention.

Simulation of Voltage-Current Characteristics of the High Frequency LDMOS Transistor Including a Buffer Well FIG. 12 is a graph illustrating the relation between voltage and current of a high frequency LDMOS transistor including a buffer P-well according to an exemplary embodiment of the present invention. In FIG. 12, solid line 200 shows the current-voltage relationship of a conventional LDMOS transistor, and dotted line 202 shows a current-voltage relationship of the high frequency LDMOS transistor of an exemplary embodiment of the present invention. The horizontal axis indicates a voltage applied between the source and the drain of an LDMOS transistor and the vertical axis indicates a saturation current passing through the drain of an LDMOS transistor in FIG. 12.

Referring to FIG. 12, when the same voltage is applied to the conventional LDMOS transistor and the LDMOS transistor of the present invention in a normal operation mode, the current in the LDMOS transistor of the present invention is greater than that of the conventional LDMOS transistor. The current difference between the conventional LDMOS transistor and the present invention indicates that the on-resistance of the LDMOS transistor of the present invention is lower than that of the conventional LDMOS transistor. A breakdown point A of the LDMOS transistor of the present invention is positioned to the right of the breakdown point B of the conventional LDMOS transistor; thus, the simulation results indicate that the breakdown voltage of the LDMOS transistor of the present invention is increased in comparison with the conventional LDMOS transistor.

According to the above simulation results, the on-resistance decreases in line with an increase of a breakdown voltage in the LDMOS transistor of the present invention. In addition, the capacitance between the gate and drain in the LDMOS transistor is not increased, thereby improving high frequency characteristics of the LDMOS transistor.

According to the present embodiment, the buffer well in the LDMOS transistor surrounds the drain heavily doped with N-type impurities, so that a bulk leakage current that leaks from the bottom of the substrate is minimized. In addition, capacitance between the gate and drain of the LDMOS transistor does not increase despite the presence of the buffer well because the buffer well is spaced apart from the gate structure, thereby maintaining high frequency characteristics of the transistor. Furthermore, the buffer well is doped with impurities more heavily than the LDD in the LDMOS transistor, so the on-resistance in the LDMOS transistor sufficiently decreases to thereby remarkably improve electrical characteristics of the LDMOS transistor.

In particular, when a semiconductor device includes both the high frequency LDMOS transistor and a CMOS transistor, the buffer well is formed simultaneously with the ion implantation process for forming a well in the CMOS transistor. Therefore, electrical characteristics of the semiconductor device may be improved without any additional process such as an ion implantation.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of manufacturing a semiconductor device, comprising:

forming a buffer N-well and an N-well of a P-type transistor on a semiconductor substrate on which a semiconductor layer is formed, and of which a surface is divided into a lateral double-diffused metal oxidation of silicon (LDMOS) region for an LDMOS transistor, a PMOS region for the P-type transistor and an NMOS region for an N-type transistor, by partially implanting N-type impurities through a surface of the LDMOS region and the PMOS region at a second concentration, so that the buffer N-well is formed on a first portion of the LDMOS region and the N-well of the P-type transistor is formed on the PMOS region;

forming a P-well of an N-type transistor on the NMOS region by partially implanting P-type impurities through a surface of the NMOS region;

forming first, second and third gate structures on the substrate of the LDMOS region spaced apart from the buffer N-well, on the substrate of the NMOS region and on the substrate of the PMOS region, respectively;

forming a lightly doped drain (LDD) between the first gate structure and the buffer N-well and a lightly doped N-type area a sides of the second gate structure by implanting N-type impurities through a surface of the LDMOS region between the first gate structure and the buffer N-well and through a surface of the NMOS region at a third concentration lower than the second concentration, respectively;

forming a source and a drain of the LDMOS transistor at surface portions of the LDMOS region, and a source and a drain of the N-type transistor at surface portions of the NMOS region by partially implanting N-type impurities into the LDMOS and NMOS regions of the substrate at a first concentration higher than the second concentration, the source of the LDMOS transistor being formed adjacent to the first gate structure on a second portion of the LDMOS region opposite to the first portion of the LDMOS region with respect to the first structure, the drain of the LDMOS transistor being formed on a substrate corresponding to the buffer N-well, and the source and drain of the NMOS transistor being formed adjacent to the second gate structure and opposite to each other with respect to the second gate structure; and forming a source and a drain of the P-type transistor at surface portions of the PMOS region by partially implanting P-type impurities into the PMOS region of the substrate adjacent to the third gate structure and opposite to each other with respect to the third gate structure.

2. The method of claim 1, wherein the semiconductor layer is formed through an epitaxial process.

3. The method of claim 1, wherein the substrate is doped with P-type impurities, and the semiconductor layer is doped with the P-type impurities at a concentration lower than that of the semiconductor substrate.

4. The method of claim 1, further comprising forming a P-type body in a second portion of the LDMOS region by implanting P-type impurities through a surface of the second portion of the LDMOS region subsequent to forming the first gate structure, the P-type impurities being diffused into a channel region under the first gate structure, so that the P-type body is extended into the channel region.

5. The method of claim 4, further comprising forming a P-sinker in the substrate of the second portion of the LDMOS region by implanting P-type impurities more deeply than the body, so that the P-sinker makes contact with the P-type body.

6. The method of claim 5, wherein the second type impurities for forming the P-sinker are implanted to a depth such that a bottom of the P-sinker makes contact with the substrate.

7. The method of claim 4, further comprising forming a contact region at a surface portion of the second portion of the LDMOS region adjacent to the source of the LDMOS transistor by implanting P-type impurities through a surface of the substrate corresponding to the second portion of the LDMOS region subsequent to forming the source, so that the contact region makes contact with the source of the LDMOS transistor in the P-type body.

8. The method of claim 1, wherein the buffer N-well and the N-well of the P-type transistor are each formed as a retrograde junction by gradually changing an ion implantation energy during the ion implantation process.

9. The method of claim 1, further comprising forming spacers at sidewalls of the first, second and third gate structures subsequent to forming the LDD and the lightly doped N-type areas.

10. The method of claim 1, wherein the drain of the LDMOS transistor is formed such that the buffer N-well surrounds side and lower portions of the drain of the LDMOS transistor.

* * * * *